United States Patent
Ishii

(10) Patent No.: US 6,670,741 B2
(45) Date of Patent: Dec. 30, 2003

(54) PLASMA PROCESSING APPARATUS WITH ANNULAR WAVEGUIDE

(75) Inventor: Nobuo Ishii, Osaka (JP)

(73) Assignees: Tokyo Electron Limited, Tokyo-To (JP); Yasuyoshi Yasaka, Kyoto-fu (JP); Makoto Ando, Kanagawa-ken (JP)

( * ) Notice: Subject to any disclaimer, the term of this patent is extended or adjusted under 35 U.S.C. 154(b) by 384 days.

(21) Appl. No.: 09/796,591

(22) Filed: Mar. 2, 2001

(65) Prior Publication Data

US 2001/0019237 A1 Sep. 6, 2001

(30) Foreign Application Priority Data

Mar. 2, 2000 (JP) .......................... 2000-057042

(51) Int. Cl.⁷ .......................... H01J 17/26; H01J 61/28
(52) U.S. Cl. .......................... 313/231.31; 313/231.01; 118/723 MW; 118/723 MP; 118/723 AN
(58) Field of Search ........................ 313/231.31, 231.01; 118/723 MW, 723 MP, 723 AN

(56) References Cited

U.S. PATENT DOCUMENTS

| | | | | |
|---|---|---|---|---|
| 5,556,501 A | * | 9/1996 | Collins et al. | ......... 156/345.38 |
| 5,688,357 A | * | 11/1997 | Hanawa | ................. 156/345.28 |
| 5,698,036 A | * | 12/1997 | Ishii et al. | .......... 118/723 MW |
| 6,284,674 B1 | * | 9/2001 | Toraguchi et al. | .......... 438/772 |
| 6,311,638 B1 | * | 11/2001 | Ishii et al. | .......... 118/723 MW |
| 6,497,783 B1 | * | 12/2002 | Suzuki et al. | .......... 156/345.34 |

* cited by examiner

Primary Examiner—Nimeshkumar D. Patel
Assistant Examiner—Kevin Quarterman
(74) Attorney, Agent, or Firm—Finnegan, Henderson, Farabow, Garrett, & Dunner LLP

(57) ABSTRACT

A plasma processing apparatus includes a processing container 53, a mounting table 61 for supporting a semiconductor wafer W arranged in the processing container 53, an endless-and-annular antenna 73 attached to a sealing plate 55 opposing the wafer W to introduce a microwave into the container 53 through the plate 55, a propagation waveguide 81 connected to the annular antenna 73 to supply the microwave to the antenna 73, and a microwave supplier 83 connected to the propagation waveguide 81 to supply the microwave to the waveguide 81. In arrangement, the annular antenna 73 is arranged so that its part along the sealing plate 55 accords with an antinode of a standing wave of the microwave, producing an uniform plasma in the processing container 53.

14 Claims, 7 Drawing Sheets

PLASMA PROCESSING APPARATUS WITH ANNULAR WAVEGUIDE

BACKGROUND OF THE INVENTION

1. Technical Field of the Invention

The present invention relates to a plasma processing apparatus utilizing a microwave.

2. Description of the Related Art

Conventionally, there is known a plasma processing apparatus which includes an antenna consisting of a waveguide arranged on the upper of a processing container to supply its interior with a microwave, as shown in FIG. 7.

This plasma apparatus 11 has a processing container 13 on which an antenna 15 is mounted. The antenna is formed by an annularly-curled waveguide having its closed end and has slots 17 formed on the side of the processing container 13. The other end of the antenna 15 is connected to a microwave generator.

In the plasma processing apparatus 11, the microwave from the generator 19 is reflected on the end 21 of the antenna 15 to form a standing wave in the waveguide. Then, the microwave is emitted into the processing container 13 through the slots 17 . . . thereby to generate a plasma for processing.

FIG. 8 shows another plasma processing apparatus 31 in which an antenna 35 in the form of an annular waveguide is wound round the outer periphery of a processing container 33 and also connected to a microwave generator 35 through a waveguide 37. In operation, the microwave supplied from the generator 39 is divided into left and right at a connecting part between the waveguide 37 and the antenna 35. Then, the so-divided microwave meet again at a part 43 on the opposite side of the connecting part 41 and is reflected mutually to form a standing wave in the antenna 35. Through slots 45 formed on the inner side of the antenna 35, the microwave is emitted into the processing chamber 33 subsequently to the above reflection, so that the plasma is produced in the container 33 for processing.

In the above-mentioned plasma processing apparatuses 11 and 31 each forming the standing wave in the antenna, however, the microwave has different intensities at each node and antinode of the standing wave. Thus, due to the positional relationship between node and antinode in the antenna, the interior of the processing container has an electromagnetic field of uneven intensity. Consequently, since the plasma produced in the processing container has an unevenness in its density, the existing plasma processing system has a problem of impossibility to maintain the uniformity of processing, hitherto.

SUMMARY OF THE INVENTION

In order to solve the above-mentioned problem, the object of the present invention resides in the provision of a plasma processing apparatus which is capable of producing an uniform plasma in a processing container thereby to accomplish an uniform processing.

The first feature of the invention resides in the plasma processing apparatus comprising: a processing container in form of a cylinder with a bottom; a supporting unit disposed in the processing container to support an object to be processed; a dielectric window arranged so as to oppose the object supported by the supporting unit to close up an opening of the processing container; an annular waveguide shaped to be an endless ring and also fitted to the dielectric window to introduce a microwave into the processing container through the dielectric window, the annular waveguide having a dielectric window part arranged along the dielectric window; a propagation waveguide connected to the annular waveguide to supply the microwave to the annular waveguide; and a microwave supplier connected to the propagation waveguide to supply the microwave to the propagation waveguide, wherein the annular waveguide is arranged so that an antinode of a standing wave of the microwave in the waveguide is located at the dielectric window part.

The second feature of the invention resides in that the microwave supplier is constructed so as to supply a high-frequency wave having a half wavelength longer than the length of the object.

The third feature of the invention resides in that the annular waveguide is shaped to be generally rectangular.

The fourth feature of the invention resides in that the annular waveguide is generally D-shape having a circumferential part and a straight part connected with the circumferential part, the straight part being arranged along the dielectric window.

The fifth feature of the invention resides in that the annular waveguide is shaped spirally and a side face of the spirally-shaped waveguide is arranged along the dielectric window.

The sixth feature of the invention resides in the plasma processing apparatus comprising: a processing container in form of a cylinder with a bottom; a supporting unit disposed in the processing container to support an object to be processed; a dielectric window arranged so as to oppose the object supported by the supporting unit to close up an opening of the processing container; an annular waveguide shaped to be an endless ring and also fitted to the dielectric window to introduce a microwave into the processing container through the dielectric window, the annular waveguide having its part arranged along the dielectric window; a propagation waveguide connected to the annular waveguide to supply the microwave to the annular waveguide; and a microwave supplier connected to the propagation waveguide to supply the microwave to the propagation waveguide, wherein a traveling wave is generated in the annular waveguide by the microwave supplied from the propagation waveguide.

The seventh feature of the invention resides in that the annular waveguide is shaped to be generally rectangular.

The eighth feature of the invention resides in that the annular waveguide is generally D-shape having a circumferential part and a straight part connected with the circumferential part, the straight part being arranged along the dielectric window.

The ninth feature of the invention resides in that the annular waveguide is shaped spirally and a side face of the spirally-shaped waveguide is arranged along the dielectric window.

The tenth feature of the invention resides in the plasma processing apparatus comprising: a processing container in form of a cylinder with a bottom; a supporting unit disposed in the processing container to support an object to be processed; a dielectric window arranged so as to oppose the object supported by the supporting unit to close up an opening of the processing container; an annular waveguide shaped to be an endless ring and also fitted to the dielectric window to introduce a microwave into the processing container through the dielectric window, the annular waveguide having its part arranged along the dielectric window; a propagation waveguide connected to the annular waveguide to supply the microwave to the annular waveguide; a microwave supplier connected to the propagation waveguide to supply the microwave to the propagation waveguide; and a traveling-wave supplier for supplying the microwave which has been propagated through the propagation waveguide, into the annular waveguide as traveling wave.

The eleventh feature of the invention resides in that the traveling-wave supplier is a directional coupler.

The twelveth feature of the invention resides in that the annular waveguide is shaped to be generally rectangular.

The 13th feature of the invention resides in that the annular waveguide is generally D-shape having a circumferential part and a straight part connected with the circumferential part, the straight part being arranged along the dielectric window.

The 14th feature of the invention resides in that the annular waveguide is shaped spirally and a side face of the spirally-shaped waveguide is arranged along the dielectric window.

The above and other features and advantages of this invention will become apparent, and the invention itself will best be understood, from a study of the following description and appended claims, with reference had to the attached drawings showing preferred embodiments of the invention.

DESCRIPTION OF THE PREFERRED EMBODIMENT

With reference to FIGS. 1 to 8, embodiments of the present invention will be described below, in detail.

Figure 1:
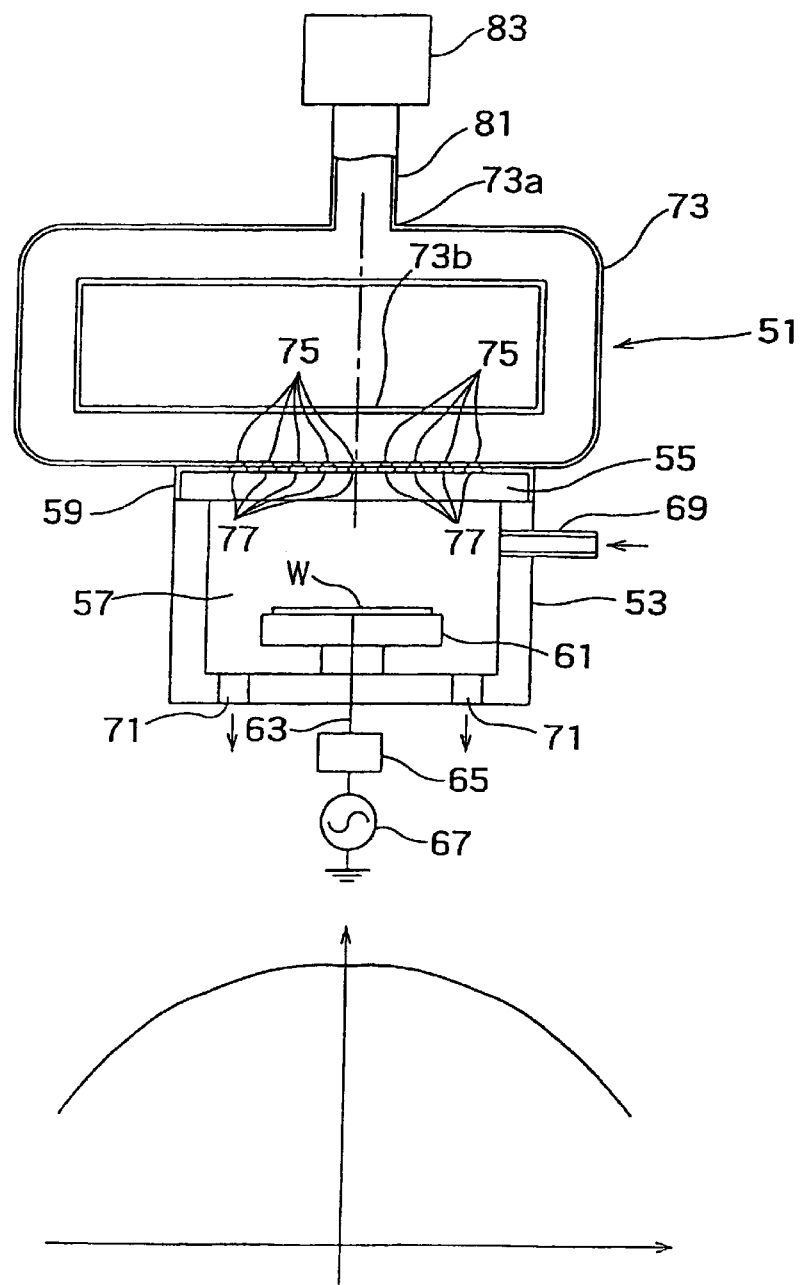
FIG. 1 is a structural view showing a plasma processing apparatus in accordance with the first embodiment of the present invention.

FIG. 1 is a structural view showing a plasma processing apparatus in accordance with the first embodiment of the present invention. In the shown example in this figure, $TE_{10}$ in the basic mode is propagated to a rectangular waveguide connected to a microwave generator, while slots are arranged on a H-plane of the waveguide.

In FIG. 1, this plasma processing apparatus 51 includes a processing container 53 whose sidewall and bottom are together made of conductive material, such as aluminum, and which is shaped to be a cylinder with bottom, as a whole.

The ceiling part of the container 53 is opened, whereas it is sealed by a sealing plate 55 having a thickness to endure a vacuum pressure, through a sealant, such as O-ring, in an airtight manner. This sealing plate 55 is made from a dielectric material exhibiting heat-resistance, microwave permeability and small dielectric loss, for example, silica glass, alumina or the like. Owing to the provision of this sealing plate 55, there is defined a processing space 57 in the processing container 53. Fitted on the sealing plate 55 is a cover member 59 in the form of a circular lid of conductive metal, which is fixed on the processing container 53.

In the processing container 53, a mounting table 61 is accommodated to mount a semiconductor wafer W as the object to be processed, thereon. The mounting table 61 is made of aluminum and also disposed on the bottom of the container 53 through an insulating member. The mounting table 61 is connected with a matching box 65 and a bias high-frequency source 67 through a power line 63. The processing container 53 is provided, on a sidewall thereof, with a gas nozzle 69 of a silica pipe to introduce a processing gas into the container 53. On the bottom of the processing container 53, there are provided exhaust ports 71, 71 communicated with a not-shown vacuum pump, allowing the interior of the processing container 53 to be evacuated to a predetermined pressure.

Arranged on the upper face of the cover member 59 is an annular antenna 73 which introduces the microwave into the processing space 57. The antenna 73 can be obtained by forming a waveguide to be rectangular, endless and annular. The antenna 73 is also arranged so that a plane containing an annular waveguide path defined by the above annular waveguide is substantially perpendicular to the sealing plate 55. Additionally, the annular antenna 73 has an electromagnetic-field emitting part 73b whose waveguide part is arranged so as to extend along the sealing plate 55. In the wall of the part 73b on the side of the processing space 57, a number of slots 75 are formed to extend in a direction generally perpendicular to the waveguide path and also separated from each other in the direction of the waveguide path. Correspondingly, the cover member 59 has openings 77, . . . formed to correspond to the slots 75, . . . , respectively. On the opposite side of the cover member 59, the annular antenna 73 is connected with one end of a propagation waveguide 81. The other end of the propagation waveguide 81 is connected to a microwave generator 83.

In the above-mentioned constitution, the microwave generator 83 is adapted so as to supply a microwave having a half wavelength longer than a length of the object to be processed. Additionally, there are established both shape and dimensions of the annular antenna 73, a position of a connecting part 73a of the antenna 73 with the propagation waveguide 81, dimensions of the electromagnetic-field emitting part 73b, etc. such that resultant standing wave has its antinode part including the object to be processed.

The microwave propagated from the microwave generator 83 is divided into microwave elements in respective opposite directions, at a connecting part 73a between the propagation waveguide 81 and the annular antenna 73. Then, the so-divided microwave elements go half round the annular waveguide 81 right and left. Consequently, the microwave elements are reflected at a position 73b where respective microwave-paths from the connecting part 73a differ from each other by half of a guide wavelength, thereby to form a standing wave as shown with a lower part of FIG. 1. According to the embodiment, both shape and dimensions of the annular antenna 73 and also the position of the connecting part 73a are respectively established so that an antinode part of the standing wave includes the object to be processed. Owing to the establishment mentioned above, it is possible to form an uniform plasma in the processing container 53, whereby an uniform treatment can be performed against even a large diameter wafer.

Thus, according to the embodiment, the microwave generator 83 is adapted so as to emit the microwave having a half wavelength longer than the length of the object to be processed. Repeatedly, both shape and dimensions of the annular antenna 73, the position of the connecting part 73a of the propagation waveguide 81 with the annular antenna 73, the dimensions of the electromagnetic-field emitting part 73b, etc. are respectively established so that the resultant standing wave includes the object through the antinode part. Accordingly, it is possible to form an uniform electromagnetic field above the object in the processing container 53, producing the uniform plasma. Therefore, even if the object to be processed is a large diameter wafer, the apparatus is capable of performing the uniform processing on the wafer.

Figure 2:
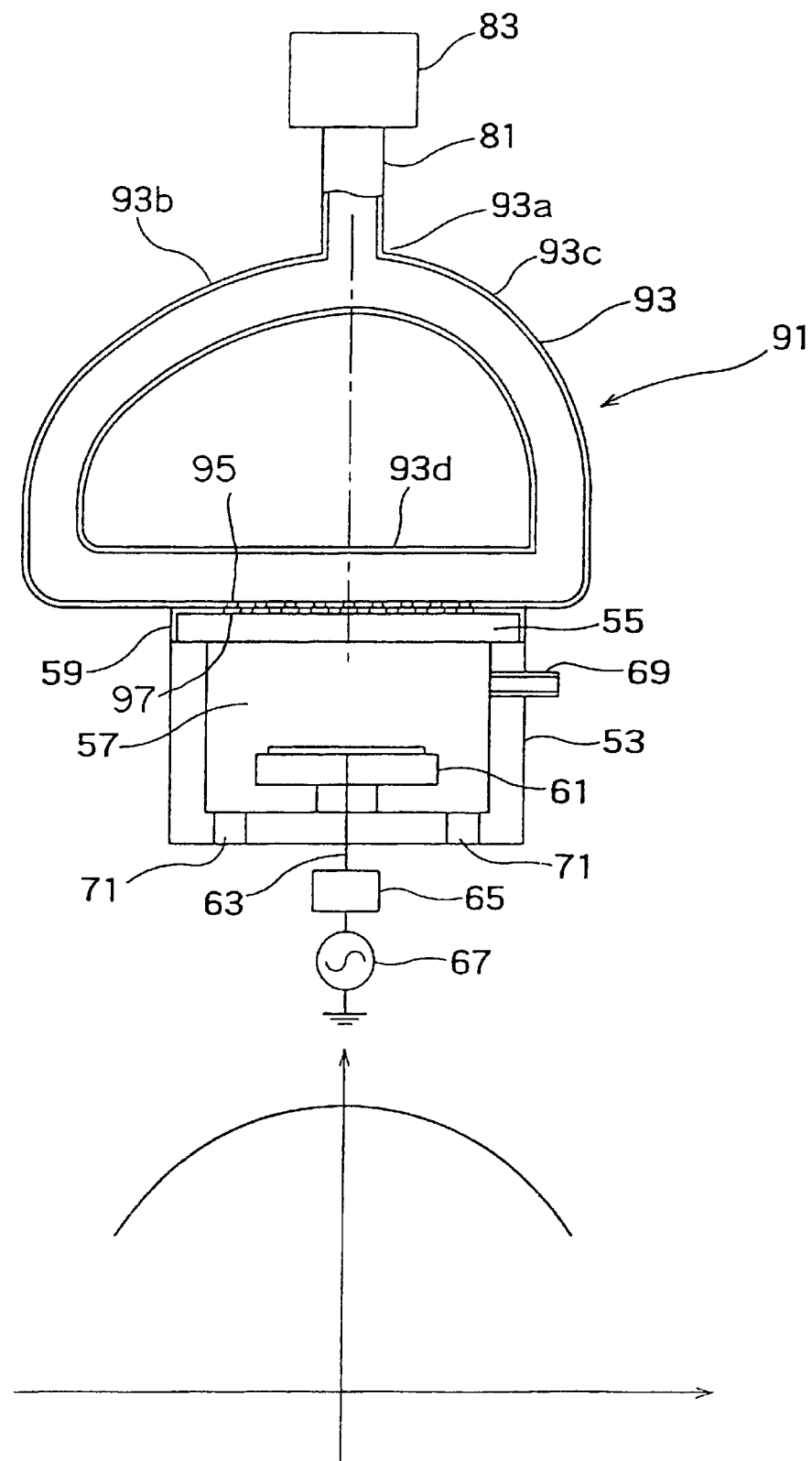
FIG. 2 is a structural view showing a plasma processing apparatus in accordance with the second embodiment of the present invention.

FIG. 2 shows the second embodiment of the invention. A plasma processing apparatus 91 shown in this figure has a generally D-shaped antenna as a modification of the rectangular-and-annular antenna 73 of the previous plasma processing apparatus 51 of FIG. 1. In the figure, elements identical to those of the plasma processing apparatus 51 of FIG. 1 are indicated with the same reference numerals, respectively. Similarly to FIG. 1, this embodiment will be described by an example where $TE_{10}$ in the basic mode is propagated to a rectangular waveguide, while slots are arranged on a H-shaped face of the waveguide.

This D-shaped annular antenna 93 comprises circular parts 93b, 93c formed to extend from a connecting part 93a connecting with the propagation waveguide 81 to the opposite directions, and a straight electromagnetic-field emitting part 93d connecting the leading end of the circular part 93b with the circular part 93c to extend along the sealing plate 55 of the processing container 53. In the wall of the part 93d on the side of the sealing plate 55, a number of slots 95 are formed to extend in a direction generally perpendicular to the waveguide path. Correspondingly, the cover member 59 has openings 97, . . . formed to correspond to the slots 95, . . . , respectively.

In the above-constructed plasma processing apparatus 91, similarly to the plasma processing apparatus 51 of FIG. 1, the microwave generator 83 is adapted so as to supply the microwave having a half wavelength longer than the length of the object to be processed. Additionally, there are established both shape and dimensions of the D-shaped annular antenna 93, a position of the connecting part 93a of the antenna 93 with the propagation waveguide 81, dimensions of the electromagnetic-field emitting part 93d, etc. such that resultant standing wave has its antinode part including the object to be processed. Therefore, it is possible to form the uniform plasma in the processing container 53, allowing the formation of an uniform plasma.

Figure 3:
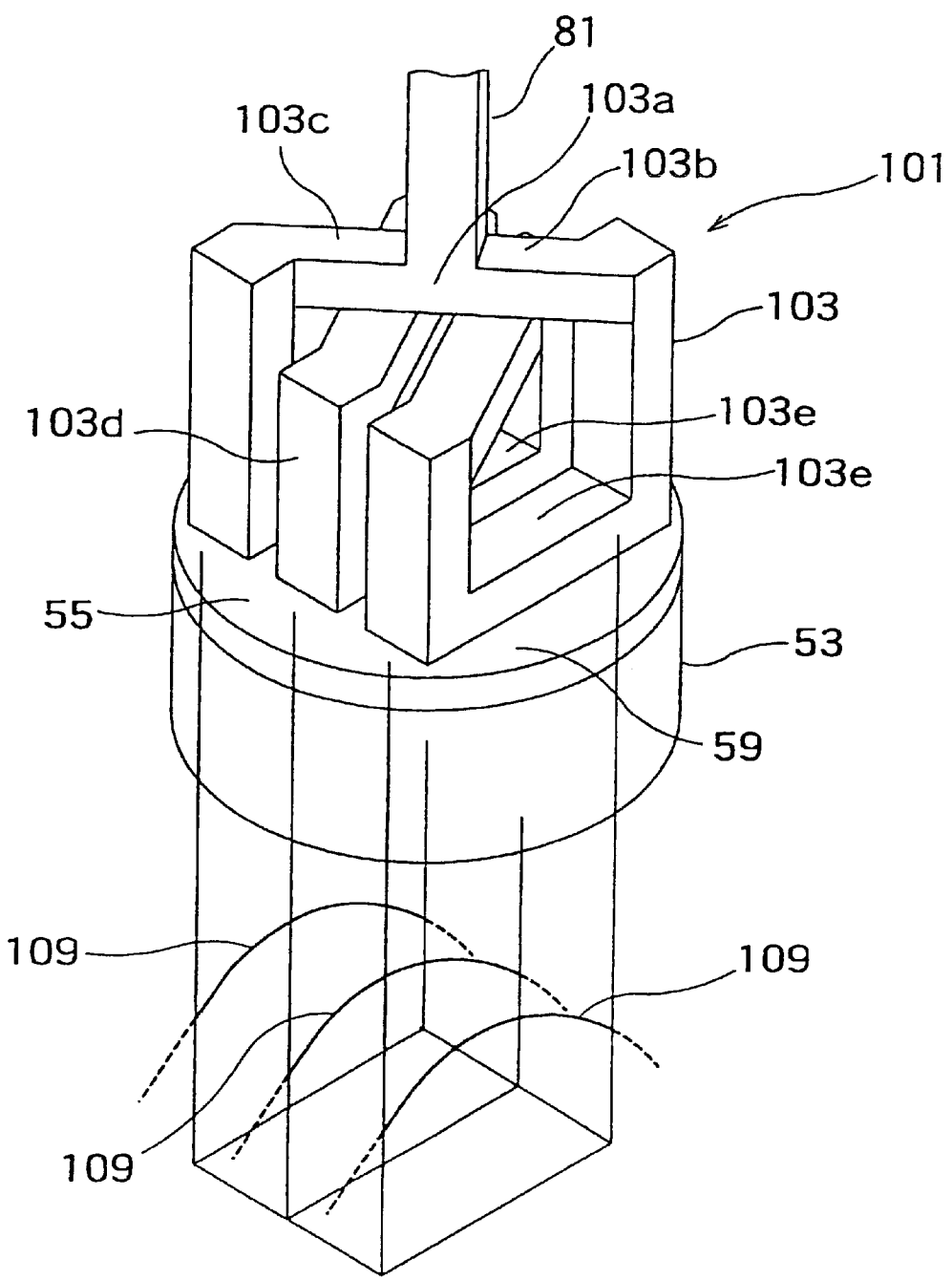
FIG. 3 is a perspective view showing a plasma processing apparatus in accordance with the third embodiment of the present invention.

FIG. 3 illustrates the third embodiment of the invention. A plasma processing apparatus 101 of the figure has a spiral-and-annular antenna 103 as the modification of the annular antenna 73 of FIG. 1. Similarly to FIG. 1, this embodiment will be described by an example where $TE_{10}$ in the basic mode is propagated to a rectangular waveguide, while slots are arranged on a H-plane of the rectangular waveguide.

The spiral-and-annular antenna 103 is connected to the propagation waveguide 81 connected to the microwave generator (not shown). This spiral-and-annular antenna 103 comprises arm parts 103b, 103c formed to extend from a connecting part 103a connecting with the propagation waveguide 81 toward both terminals of a spiral in the opposite directions, and a spiral part 103d extending from an end of the arm part 103b to an end of the other arm part 103c spirally. The spiral part 103d is arranged so that its side face(s) follows the sealing plate 55 and also provided with a plurality of electromagnetic-field emitting parts 103e along the plate 55. In the wall of the parts 103e on the side of the sealing plate 55, a number of slots (not shown) are formed to extend in a direction generally perpendicular to the longitudinal direction of the waveguide. Correspondingly, the cover member 59 has not-shown openings formed to correspond to the slots, respectively.

In the above-mentioned structure, the microwave generator (not shown) is adapted so that the spiral-and-annular antenna 103 supplies the microwave having a half wavelength longer than the length of the object to be processed. Additionally, there are established both shape and dimensions of the antenna 103, a position of the connecting part 103a of the antenna 103 with the propagation waveguide 81, dimensions of the electromagnetic-field emitting parts 103e, etc. such that resultant standing waves have their antinode parts 109 including the object to be processed, respectively. In detail, the microwave propagated from the microwave generator is divided into microwave elements in respective opposite directions, at the connecting part 103a between the propagation waveguide 81 and the antenna 103. Then, the so-divided microwave elements go half round the waveguide 103 right and left. Consequently, the microwave elements are reflected at a position where respective microwave-paths from the connecting part 103a differ from each other by half of a pipe wavelength, thereby to form a plurality of standing waves. Under such a situation, both shape and dimensions of the antenna 103, the position of the connecting part 103, etc. are respectively established so that the plural antinode parts 109 of the standing waves include the plural electromagnetic-field emitting parts 103e. Owing to the establishment mentioned above, it is possible to form the uniform plasma over the object in the processing container 53. Therefore, even if the object to be processed is a large diameter wafer, the apparatus is capable of performing an uniform treatment, for example, etching and filming, on the wafer.

Figure 4:
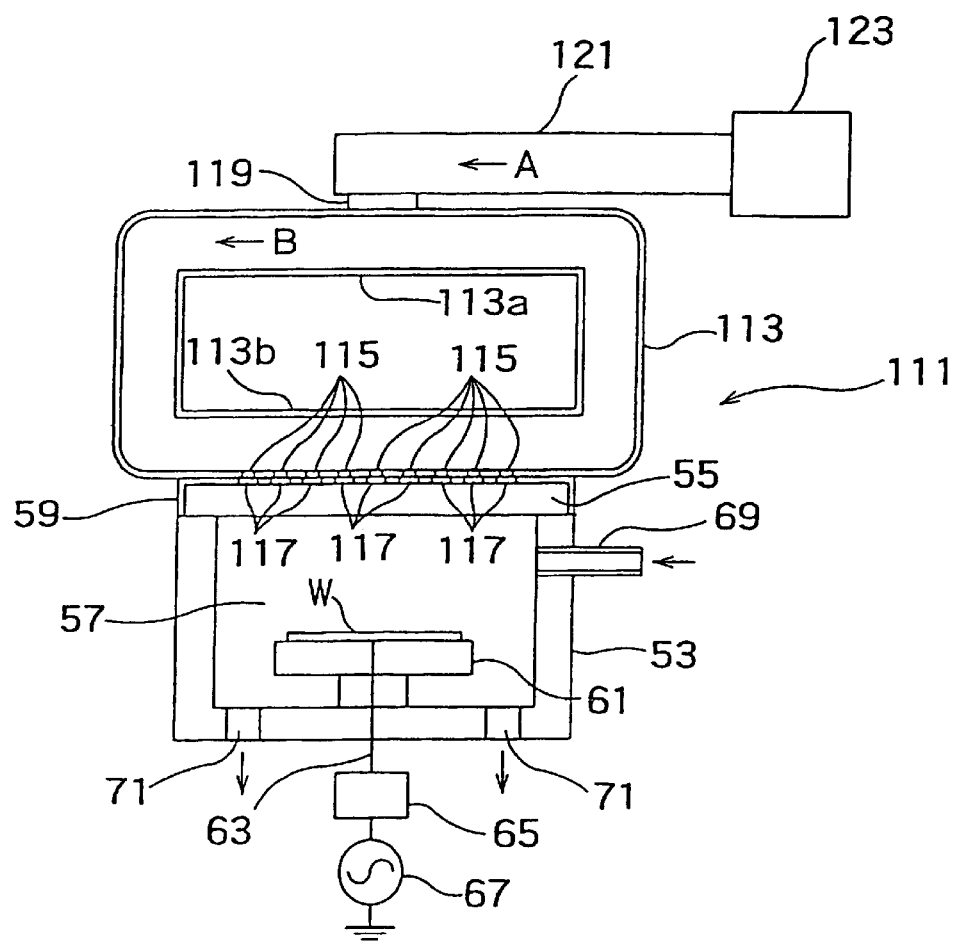
FIG. 4 is a structural view showing a plasma processing apparatus in accordance with the fourth embodiment of the present invention.
Figure 5:
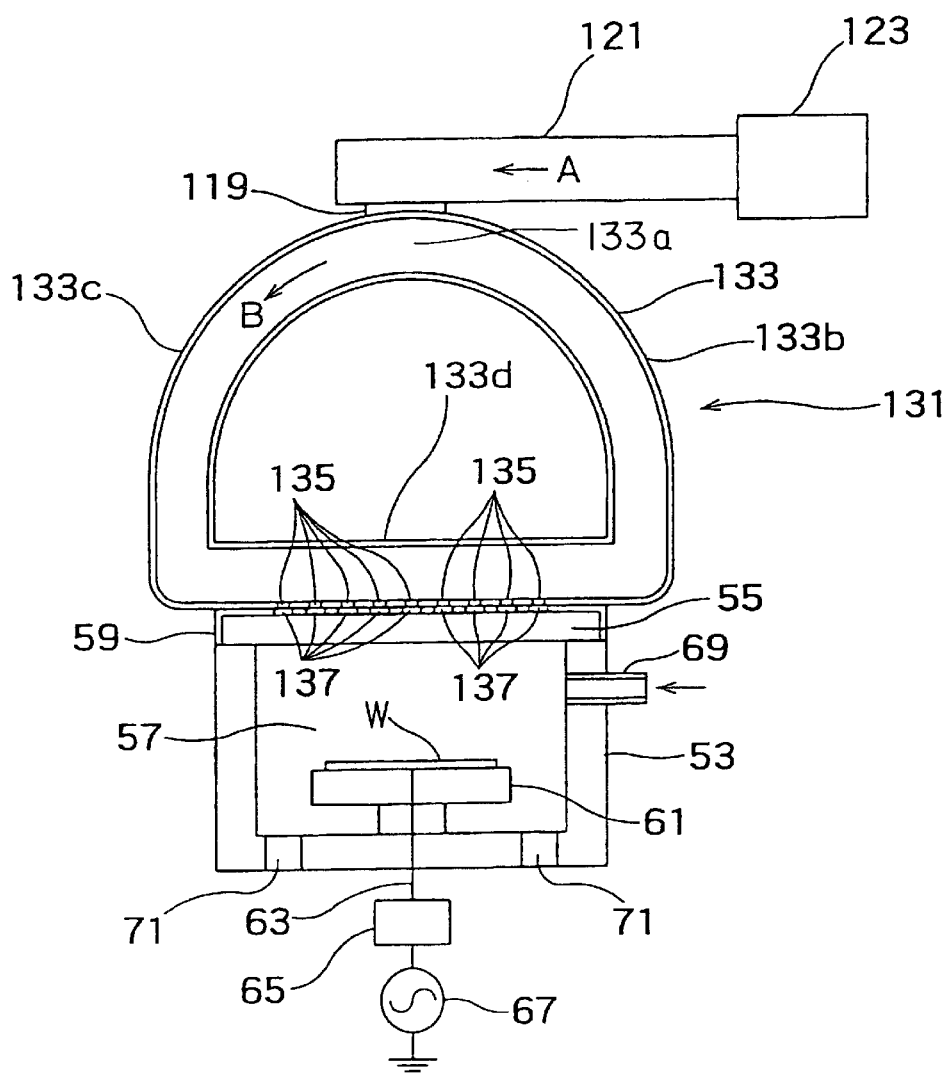
FIG. 5 is a structural view showing a plasma processing apparatus in accordance with the fifth embodiment of the present invention.
Figure 6:
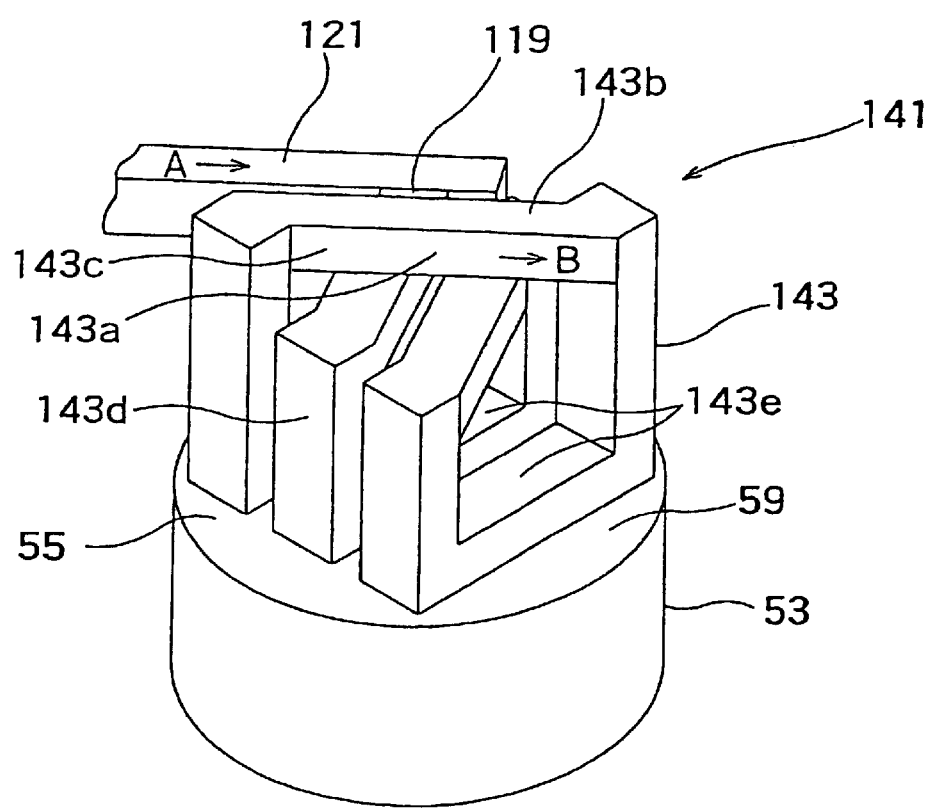
FIG. 6 is a perspective view showing a plasma processing apparatus in accordance with the sixth embodiment of the present invention.
Figure 7:
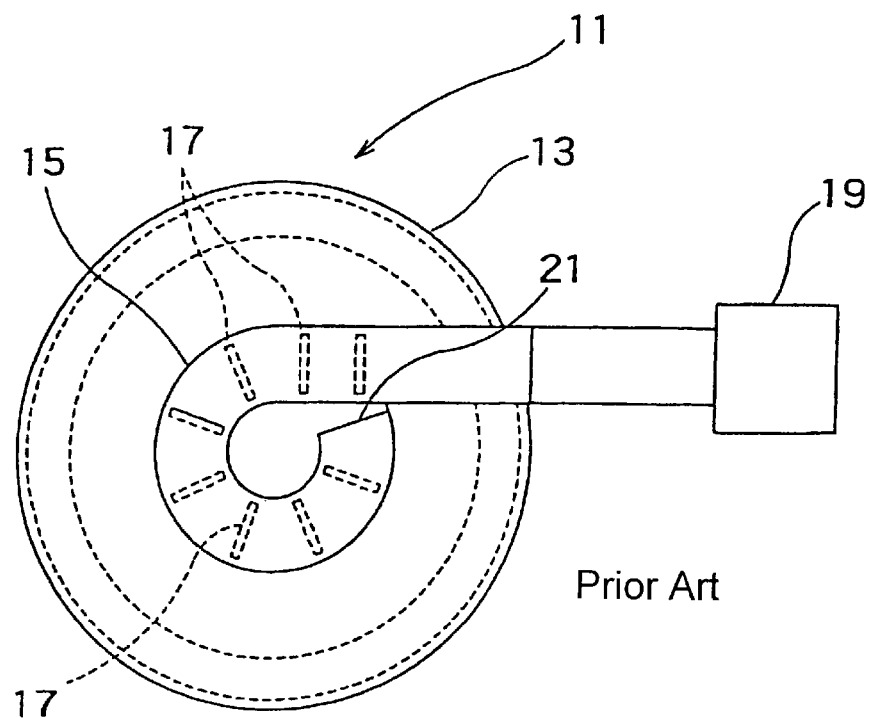
FIG. 7 is a plan view showing the conventional plasma processing apparatus.
Figure 8:
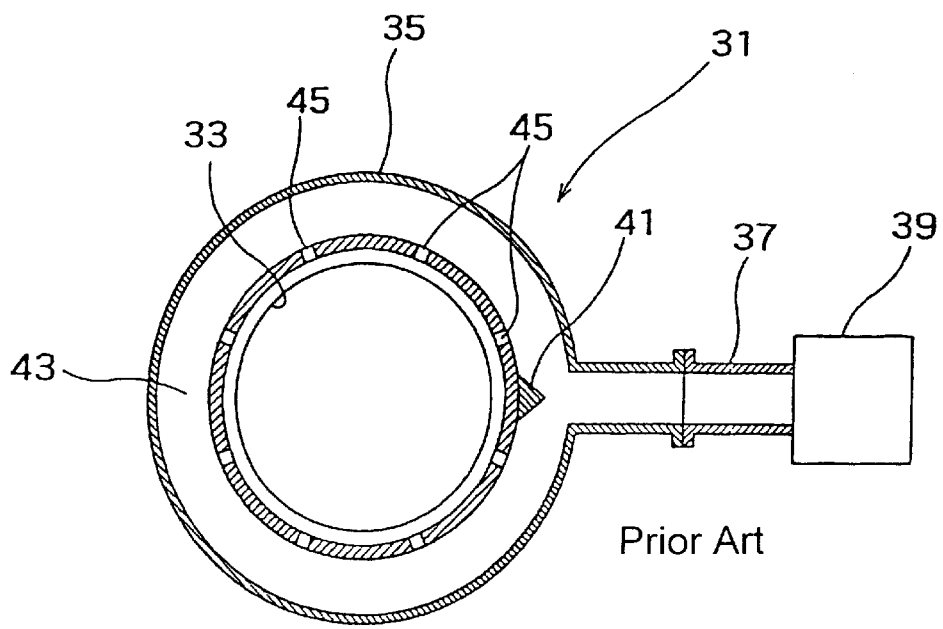
FIG. 8 is a structural view showing the conventional plasma processing apparatus.

FIGS. 4, 5 and 6 show the fourth, fifth and the sixth embodiments, respectively. Different from the plasma processing apparatuses of FIGS. 1 to 4, the plasma processing apparatuses of these embodiments each supplies a traveling wave to the annular antenna and further provides the processing container with an electromagnetic field via the part of the annular antenna extending along the sealing plate, thereby accomplishing the plasma processing. In these figures, elements similar to those of the plasma processing apparatus of FIG. 1 are indicated with the same reference numerals, respectively.

FIG. 4 shows the fourth embodiment of the invention. The shown plasma processing apparatus 111 has the annular antenna 113 arranged on the upper face of the cover member 59 to introduce the microwave into the processing space 57. The annular antenna 113 can be obtained by forming a waveguide to be rectangular, endless and annular. The antenna 113 is also arranged so that a plane containing an annular waveguide path defined by the above annular waveguide is substantially perpendicular to the sealing plate 55. Additionally, the annular antenna 113 has an electromagnetic-field emitting part 113b whose waveguide part is arranged so as to extend along the sealing plate 55.

In the wall of the part 113b on the side of the processing space 57, a number of slots 115 are formed to extend in a direction generally perpendicular to the waveguide path and also separated, on e.g. a H-plane, from each other in the direction of the waveguide path. Correspondingly, the cover member 59 has openings 117, . . . formed to correspond to the slots 115, . . . , respectively. On the opposite side of the cover member 59, a propagation waveguide 121 has its end connected with a E-plane of the annular antenna 113 through a directional coupler 119. The other end of the propagation waveguide 121 is connected to a microwave generator 123. The above directional coupler 119 propagates the microwave, which has been propagated in a direction of arrow A in the propagation waveguide 121, only in a direction of arrow B in the annular antenna 113. In this way, the microwave is propagated in the endless-and-annular antenna 113, as a traveling wave in the only one direction (arrow B).

According to the above-mentioned constitution, the microwave emitted from the microwave generator 123 is propagated in the propagation waveguide 121 in the direction of arrow A and is fed into the annular antenna 113 at the directional coupler 119. Since the directional coupler 119 is arranged at a connecting part between the propagation waveguide 121 and the annular antenna 113, the microwave after traveling in the propagation waveguide 121 in the direction of arrow A is propagated only in the direction of arrow B, so that a traveling wave cycling in the endless-and-annular antenna 113 is formed. The microwave propagated as the traveling wave in the annular antenna 113 is discharged into the processing container 53 through the slots 115 of great number. Since the microwave in the antenna 113 is not a standing wave but a traveling wave rotating therein, the intensity of electromagnetic field emitted from the slots 115 is equalized in time. Accordingly, it is possible to produce the uniform plasma in the processing container 53, whereby the uniform treatment could be applied on even a large diameter wafer over the whole area.

Repeatedly, in the plasma processing apparatus 111, the antenna 113 is also arranged so that the plane containing the annular waveguide path defined by the above annular waveguide is substantially perpendicular to the sealing plate 55. Additionally, the annular antenna 113 has the electromagnetic-field emitting part 113b whose waveguide part is arranged so as to extend along the sealing plate 55. In the wall of the part 113b on the side of the processing space 57, the slots 115 are formed to extend in a direction generally perpendicular to the waveguide path and also separated from each other in the direction of the waveguide path. On the opposite side of the cover member 59, the propagation waveguide 121 has its end connected with a face E of the annular antenna 113 through the directional coupler 119. The other end of the propagation waveguide 81 is connected to the microwave generator 123. Therefore, the shown apparatus 111 is capable of formation of an endless-and-annular traveling wave in the annular antenna 113, allowing an uniform electromagnetic field to be emitted in the processing container 53. Consequently, the uniform plasma can be produced in the processing container 53, accomplishing the uniform treatment in spite of a large diameter wafer.

FIG. 5 shows the fifth embodiment of the invention. A plasma processing apparatus 131 shown in this figure has a generally D-shaped antenna as a modification of the rectangular-and-annular antenna 113 of the previous plasma processing apparatus 111 of FIG. 4. In the figure, elements identical to those of the plasma processing apparatus 111 of FIG. 4 are indicated with the same reference numerals, respectively.

This D-shaped annular antenna 133 comprises circular parts 133b, 133c formed to extend from a connecting part 133a connecting with the propagation waveguide 121 to the opposite directions, and a straight electromagnetic-field emitting part 133d connecting the leading end of the circular part 133b with the circular part 133c to extend along the sealing plate 55 of the processing container 53. In the wall of the part 133d on the side of the sealing plate 55, a number of slots 135 are formed to extend in a direction generally perpendicular to the longitudinal direction of the waveguide. Correspondingly, the cover member 59 has openings formed to correspond to the slots 135, respectively. While, the propagation waveguide 121 has its end connected with a E-plane of the annular antenna 133 through the directional coupler 119. The other end of the propagation waveguide 121 is connected to the microwave generator 123. The above directional coupler 119 propagates the microwave, which has been propagated in a direction of arrow A in the propagation waveguide 121, only in a direction of arrow B in the annular antenna 113. In this way, the microwave is propagated in the endless-and-annular antenna 113, as a traveling wave in only one direction (arrow B).

According to the above-mentioned constitution, the microwave emitted from the microwave generator 123 is propagated in the propagation waveguide 121 in the direction of arrow A. Next, the microwave is propagated in the D-shaped annular antenna 133 only in the direction of arrow B by the directional coupler 119, so that a traveling wave is formed to rotate in the antenna 133. Since the microwave in the antenna 133 is identical to a traveling wave rotating in the endless antenna 133, the intensity of electromagnetic field emitted from the slots 135 is equalized. Accordingly, it is possible to produce the uniform plasma in the processing container 53, whereby the uniform treatment could be applied on even a large diameter wafer over the whole area.

FIG. 6 illustrates the sixth embodiment of the present invention. A plasma apparatus 101 of FIG. 3 in that the former produces a traveling wave in an annular antenna while the latter does a standing wave therein. In FIG. 6, elements similar to those of the apparatus 101 of FIG. 3 will be indicated with the same reference numerals, respectively.

In the plasma processing apparatus 141 shown in FIG. 6, a spiral-and-annular antenna 143 is connected to the propagation waveguide 121 (e.g. a E-plane of the waveguide) through the directional coupler 119. The propagation waveguide 121 is connected to the microwave generator (not shown). This spiral-and-annular antenna 143 comprises arm parts 143b, 143c formed to extend from a connecting part 143a connecting with the directional coupler 119 in the opposite directions, and a spiral part 143d spirally formed to extend from one end of the arm part 143b toward one end of the other arm part 143c. The spiral part 143d is arranged so that its side face(s) follows the sealing plate 55 and also provided with a plurality of electromagnetic-field emitting parts 143e along the plate 55. In the wall of the parts 143e on the side of the sealing plate 55, a number of slots (not shown) are formed to extend in a direction generally perpendicular to the longitudinal direction of the waveguide. Correspondingly, the cover member 59 has not-shown openings formed to correspond to the slots, respectively. The above directional coupler 119 for connecting the antenna 143 with the propagation waveguide 121 propagates the microwave, which has been propagated in a direction of arrow A in the propagation waveguide 121, only in a direction of arrow B in the annular antenna 143. In this way, the microwave is propagated in the endless, spiral and annular antenna 143, as a traveling wave in the only one direction (arrow B).

According to the above-mentioned constitution, the microwave emitted from the microwave generator is propagated in the propagation waveguide 121 in the direction of arrow A. Next, the microwave is propagated in the spiral-and-annular antenna 143 only in the direction of arrow B by the directional coupler 119, so that a traveling wave is formed to rotate in the antenna 143. Since the microwave in the antenna 143 is identical to a traveling wave rotating in the endless antenna 143, the intensity of electromagnetic field emitted from the electromagnetic-field emitting parts 143e into the processing container 53 is equalized. Accordingly, it is possible to produce the uniform plasma in the processing container 53, whereby the uniform treatment could be applied on even a large diameter wafer over the whole area.

As mentioned above, according to the present invention, there is provided the plasma processing apparatus which comprises the processing container in form of a cylinder with a bottom, the carrying unit disposed in the processing container to carry an object to be processed, the dielectric window arranged so as to oppose the object carried by the carrying unit to close up an opening of the processing container, the annular waveguide shaped to be an endless ring and also fitted to the dielectric window to introduce the microwave into the processing container through the dielectric window, the annular waveguide having its part arranged along the dielectric window, the propagation waveguide connected to the annular waveguide to supply the microwave to the annular waveguide and the microwave supplier connected to the propagation waveguide to supply the microwave to the propagation waveguide. Further, in this apparatus, the annular waveguide is arranged so that the part along the dielectric window accords with an antinode of a standing wave of the microwave. Therefore, it is possible to supply the interior of the processing container with an uniform electromagnetic field, accomplishing the uniform treatment in the same container.

Additionally, there is also provided the plasma processing apparatus which comprises the processing container in form of a cylinder with a bottom, the carrying unit disposed in the processing container to carry an object to be processed, the dielectric window arranged so as to oppose the object carried by the carrying unit to close up an opening of the processing container, the annular waveguide shaped to be an endless ring and also fitted to the dielectric window to introduce a microwave into the processing container through the dielectric window, the annular waveguide having its part arranged along the dielectric window, the propagation waveguide connected to the annular waveguide to supply the microwave to the annular waveguide and the microwave supplier connected to the propagation waveguide to supply the microwave to the propagation waveguide. The plasma processing apparatus is further constructed so as to form a traveling wave in the annular waveguide by the microwave supplied from the propagation waveguide. Accordingly, it is possible to produce the uniform plasma in the processing container, accomplishing the uniform treatment to the whole area of a large diameter object to be processed.

What is claimed is:

1. A plasma processing apparatus comprising:
   a processing container in form of a cylinder with a bottom;
   a supporting unit disposed in the processing container to support an object to be processed;
   a dielectric window arranged so as to oppose the object supported by the supporting unit to close up an opening of the processing container;
   an annular waveguide shaped to be an endless ring and also fitted to the dielectric window to introduce a microwave into the processing container through the dielectric window, the annular waveguide having a dielectric window part arranged along the dielectric window;
   a propagation waveguide connected to the annular waveguide to supply the microwave to the annular waveguide; and
   a microwave supplier connected to the propagation waveguide to supply the microwave to the propagation waveguide,
   wherein the annular waveguide is arranged so that an antinode of a standing wave of the microwave in the waveguide is located at the dielectric window part.

2. A plasma processing apparatus as claimed in claim 1, wherein
   the microwave supplier is constructed so as to supply a high-frequency wave having a half wavelength longer than the length of the object.

3. A plasma processing apparatus as claimed in claim 1, wherein
   the annular waveguide is shaped to be generally rectangular.

4. A plasma processing apparatus as claimed in claim 1, wherein
   the annular waveguide is generally D-shape having a circumferential part and a straight part connected with the circumferential part, the straight part being arranged along the dielectric window.

5. A plasma processing apparatus as claimed in claim 1, wherein
   the annular waveguide is shaped spirally and a side face of the spirally-shaped waveguide is arranged along the dielectric window.

6. A plasma processing apparatus comprising:
   a processing container in form of a cylinder with a bottom;
   a supporting unit disposed in the processing container to support an object to be processed;
   a dielectric window arranged so as to oppose the object supported by the supporting unit to close up an opening of the processing container;
   an annular waveguide shaped to be an endless ring and also fitted to the dielectric window to introduce a microwave into the processing container through the dielectric window, the annular waveguide having its part arranged along the dielectric window;
   a propagation waveguide connected to the annular waveguide to supply the microwave to the annular waveguide; and
   a microwave supplier connected to the propagation waveguide to supply the microwave to the propagation waveguide,
   wherein a traveling wave is generated in the annular waveguide by the microwave supplied from the propagation waveguide.

7. A plasma processing apparatus as claimed in claim 6, wherein
   the annular waveguide is shaped to be generally rectangular.

8. A plasma processing apparatus as claimed in claim 6, wherein
   the annular waveguide is generally D-shape having a circumferential part and a straight part connected with the circumferential part, the straight part being arranged along the dielectric window.

9. A plasma processing apparatus as claimed in claim 6, wherein the annular waveguide is shaped spirally and a side face of the spirally-shaped waveguide is arranged along the dielectric window.

10. A plasma processing apparatus comprising:

a processing container in form of a cylinder with a bottom;

a supporting unit disposed in the processing container to support an object to be processed;

a dielectric window arranged so as to oppose the object supported by the supporting unit to close up an opening of the processing container;

an annular waveguide shaped to be an endless ring and also fitted to the dielectric window to introduce a microwave into the processing container through the dielectric window, the annular waveguide having its part arranged along the dielectric window;

a propagation waveguide connected to the annular waveguide to supply the microwave to the annular waveguide;

a microwave supplier connected to the propagation waveguide to supply the microwave to the propagation waveguide; and a traveling-wave supplier for supplying the microwave which has been propagated through the propagation waveguide, into the annular waveguide as traveling wave.

11. A plasma processing apparatus as claimed in claim 10, wherein the traveling-wave supplier is a directional coupler.

12. A plasma processing apparatus as claimed in claim 10, wherein the annular waveguide is shaped to be generally rectangular.

13. A plasma processing apparatus as claimed in claim 10, wherein the annular waveguide is generally D-shape having a circumferential part and a straight part connected with the circumferential part, the straight part being arranged along the dielectric window.

14. A plasma processing apparatus as claimed in claim 10, wherein the annular waveguide is shaped spirally and a side face of the spirally-shaped waveguide is arranged along the dielectric window.

* * * * *